US012666559B2

(12) United States Patent
Wingfield et al.

(10) Patent No.: US 12,666,559 B2
(45) Date of Patent: Jun. 23, 2026

(54) SYSTEMS AND METHODS FOR COMBINED RETENTION OF RISER ASSEMBLIES AND EXPANSION CARDS HOUSED THEREIN

(71) Applicant: Dell Products L.P., Round Rock, TX (US)

(72) Inventors: Megan Cherie Wingfield, Box Elder, SD (US); Eduardo Escamilla, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 107 days.

(21) Appl. No.: 18/653,710

(22) Filed: May 2, 2024

(65) Prior Publication Data

US 2025/0344332 A1     Nov. 6, 2025

(51) Int. Cl.
*H05K 7/14*          (2006.01)
(52) U.S. Cl.
CPC .................................. *H05K 7/1489* (2013.01)
(58) Field of Classification Search
None
See application file for complete search history.

(56) References Cited

U.S. PATENT DOCUMENTS

| | | | |
|---|---|---|---|
| 8,625,258 B2 * | 1/2014 | Li | G06F 1/185 |
| | | | 361/679.01 |
| 11,269,385 B2 * | 3/2022 | Chang | G06F 1/185 |
| 12,408,288 B2 * | 9/2025 | Chianghsieh | H05K 7/1487 |
| 2008/0198564 A1 * | 8/2008 | Chang | G06F 1/186 |
| | | | 361/759 |
| 2013/0107441 A1 * | 5/2013 | Zhou | G06F 1/185 |
| | | | 248/298.1 |
| 2023/0009926 A1 * | 1/2023 | Tsorng | H05K 7/1409 |
| 2024/0164043 A1 * | 5/2024 | Tsorng | G06F 1/185 |
| 2024/0314967 A1 * | 9/2024 | Hsieh | G06F 1/185 |

* cited by examiner

*Primary Examiner* — James Wu
*Assistant Examiner* — Christopher L Augustin
(74) *Attorney, Agent, or Firm* — Jackson Walker L.L.P.

(57)          ABSTRACT
An information handling system may include a chassis and an information handling resource assembly configured to carry one or more information handling resources. The information handling resource assembly may include a first latch and a second latch configured to mechanically couple to an alignment feature mechanically coupled to the chassis such that the first latch retains the information handling resource assembly within the chassis, and the second latch retains the one or more information handling resources in the information handling resource assembly.

15 Claims, 5 Drawing Sheets

SYSTEMS AND METHODS FOR COMBINED RETENTION OF RISER ASSEMBLIES AND EXPANSION CARDS HOUSED THEREIN

TECHNICAL FIELD

The present disclosure relates in general to information handling systems, and more particularly to systems and methods for combined retention of a riser assembly and expansion cards housed therein in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many information handling systems utilize one or more riser cards. A riser card is a printed circuit board that gives a motherboard of the information handling system the option for additional expansion cards to be added to the information handling system. Thus, a riser card is usually coupled to a motherboard receptacle connector via an edge connector, and may include one or more receptacle connectors mounted on the riser card to receive expansion cards in order to electrically couple such expansion cards to the motherboard. Accordingly, in general, the main purpose of a riser card may be to change the orientation of the expansion cards such that they fit a limited space within casing.

In order to provide mechanical structure for the riser card, its connectors, and expansion cards coupled to the riser card, a riser mechanical assembly may be used to house the riser card, its connectors, and expansion cards coupled to the riser card, and may also include mechanical features to mechanically retain the edge connector of the riser card within the receptacle connector of the motherboard. The riser mechanical assembly may also include mechanical features to install and retain the edge connector of the expansion card within the receptacle connector of the riser card. The riser mechanical assembly may further include mechanical features to mechanically align and retain the riser mechanical assembly within a chassis.

Often, the mechanical features for retaining the expansion card and the mechanical features for retaining the riser mechanical assembly in the chassis mechanically couple to different fasteners (e.g., pins) in the chassis. However, utilizing separate fasteners may increase the footprint of the riser mechanical assembly. It may also cause tracing or routing issues in the motherboard. Accordingly, systems and methods for combining retention of mechanical assemblies and expansion cards within a chassis may be desired.

SUMMARY

In accordance with the teachings of the present disclosure, the disadvantages and problems associated with existing approaches to retaining a riser mechanical assembly and expansion cards housed therein within a chassis may be reduced or eliminated.

In accordance with embodiments of the present disclosure, an information handling system may include a chassis and an information handling resource assembly configured to carry one or more information handling resources. The information handling resource assembly may include a first latch and a second latch configured to mechanically couple to an alignment feature mechanically coupled to the chassis such that the first latch retains the information handling resource assembly within the chassis, and the second latch retains the one or more information handling resources in the information handling resource assembly.

In accordance with embodiments of the present disclosure, a combined retention feature may include a first latch and a second latch configured to mechanically couple to an alignment feature mechanically coupled to a chassis such that the first latch retains an information handling resource assembly within the chassis, and the second latch retains one or more information handling resources in the information handling resource assembly.

In accordance with embodiments of the present disclosure, a method of forming a combined retention feature may include mechanically coupling a first latch to an information handling resource assembly configured to carry one or more information handling resources, and mechanically coupling a second latch to the information handling resource assembly. The first latch and the second latch may be configured to mechanically couple to an alignment feature mechanically coupled to a chassis such that the first latch retains the information handling resource assembly within the chassis, and the second latch retains the one or more information handling resources in the information handling resource assembly.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
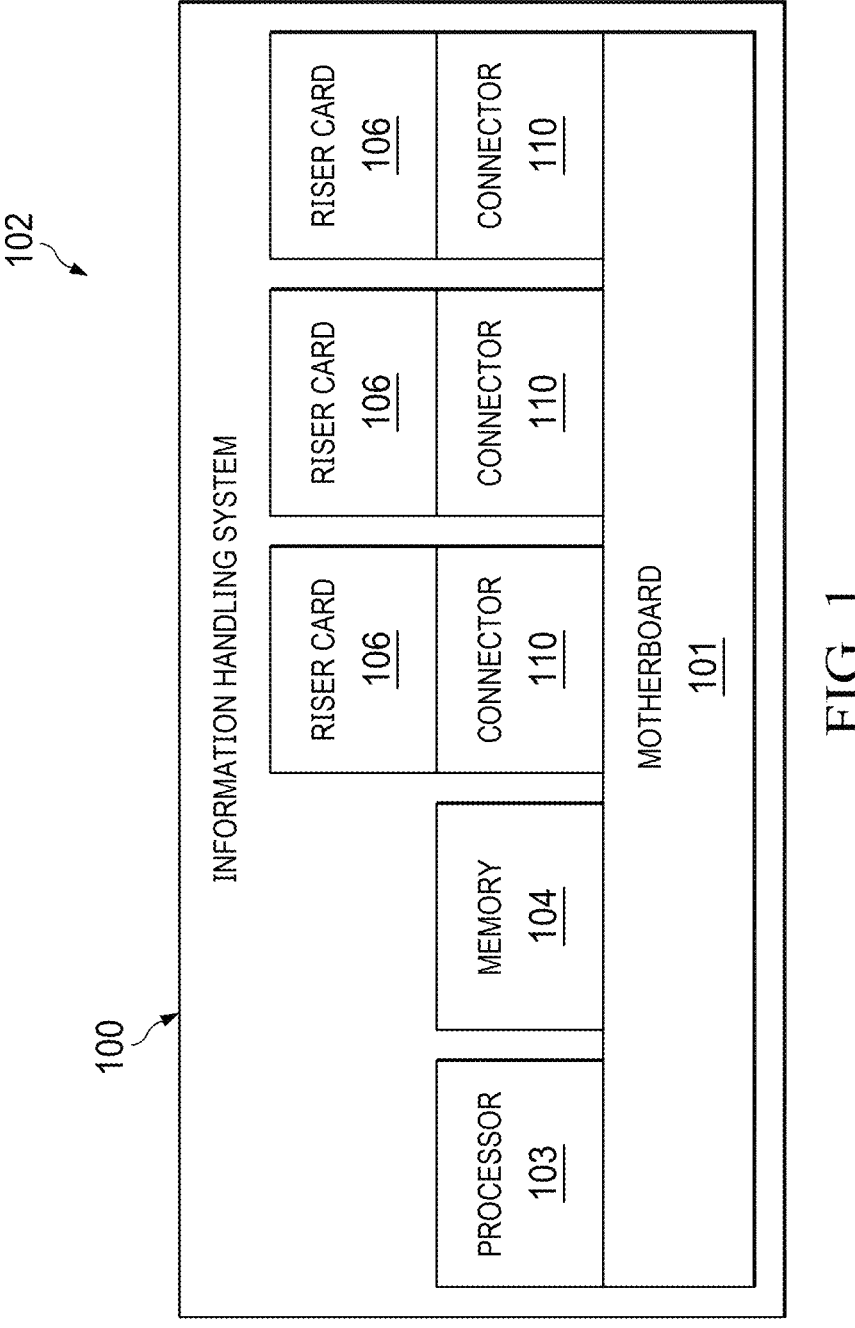
FIG. 1 illustrates a block diagram of selected components of an example information handling system, in accordance with embodiments of the present disclosure.

Preferred embodiments and their advantages are best understood by reference to FIGS. 1 through 4, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and vary in size, shape, performance, functionality, and price. The information handling system may include memory, one or more processing resources such as a central processing unit ("CPU"), microcontroller, or hardware or software control logic. Additional components of the information handling system may include one or more devices, storage one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs), etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

FIG. 1 illustrates a block diagram of selected components of an example information handling system 102. In some embodiments, information handling system 102 may comprise a server. In other embodiments, information handling system 102 may comprise networking equipment for facilitating communication over a communication network. In yet other embodiments, information handling system 102 may comprise a personal computer, such as a laptop, notebook, or desktop computer.

As shown in FIG. 1, information handling system 102 may include a chassis 100 that houses a motherboard 101, a processor 103 coupled to motherboard 101, a memory 104 coupled to motherboard 101, connectors 110 mechanically and electrically coupled to motherboard 101, and a plurality of riser cards 106 electrically coupled to motherboard 101 via respective connectors 110.

Chassis 100 may include any suitable housing or enclosure configured to house the various components of information handling system 102, and may be constructed from metal, plastic, and/or any other suitable material.

Motherboard 101 may comprise a circuit board configured to provide structural support for one or more information handling resources of information handling system 102 and/or electrically couple one or more of such information handling resources to each other and/or to other electric or electronic components external to information handling system 102.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in a storage resource, memory system 104, and/or another component of information handling system 102.

Memory 104 may be communicatively coupled to processor 103 and may comprise any system, device, or apparatus operable to retain program instructions or data for a period of time (e.g., computer-readable media). Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off. In particular embodiments, memory 104 may comprise dynamic random access memory (DRAM).

A connector 110 may comprise any system, device, or apparatus fixedly mounted on motherboard 101 and may be constructed to mechanically couple a corresponding riser card 106 to motherboard 101 and to electrically couple such riser card 106 to motherboard 101, processor 103, and/or other components of information handling system 102. Connector 110 may comprise a socket including a receptacle slot or other opening configured to removably receive a corresponding mating edge connector of riser card 106.

A riser card 106 may comprise a circuit board enabling the option for additional expansion cards to be coupled to motherboard 101. Riser card 106 may be coupled to connector 110 via an edge connector (not explicitly shown in FIG. 1), and may include one or more receptacle connectors mounted (not explicitly shown in FIG. 1) on riser card 106 to receive expansion cards in order to electrically couple such expansion cards to motherboard 101.

In addition to motherboard 101, processor 103, memory 104, riser cards 106, and connectors 110, information handling system 102 may include one or more other information handling resources. As described in further detail below, a riser assembly may be configured to house one or more riser cards 106, connectors 110 of such one or more riser card 106, and any expansion cards coupled to each riser card 106.

Figure 2A:
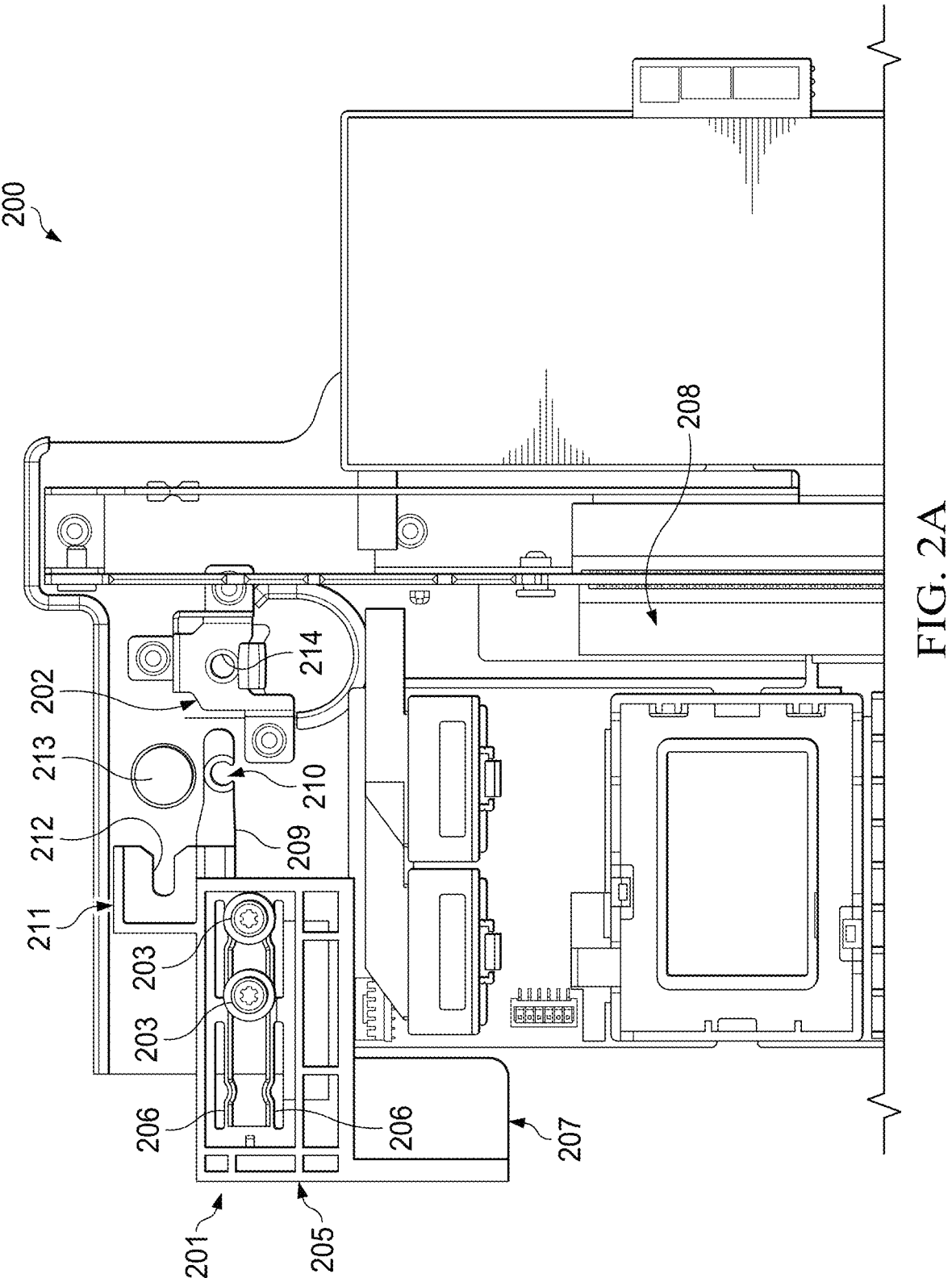
FIGS. 2A-2B illustrate plan views of selected components of an example riser assembly, in accordance with embodiments of the present disclosure.
Figure 2B:
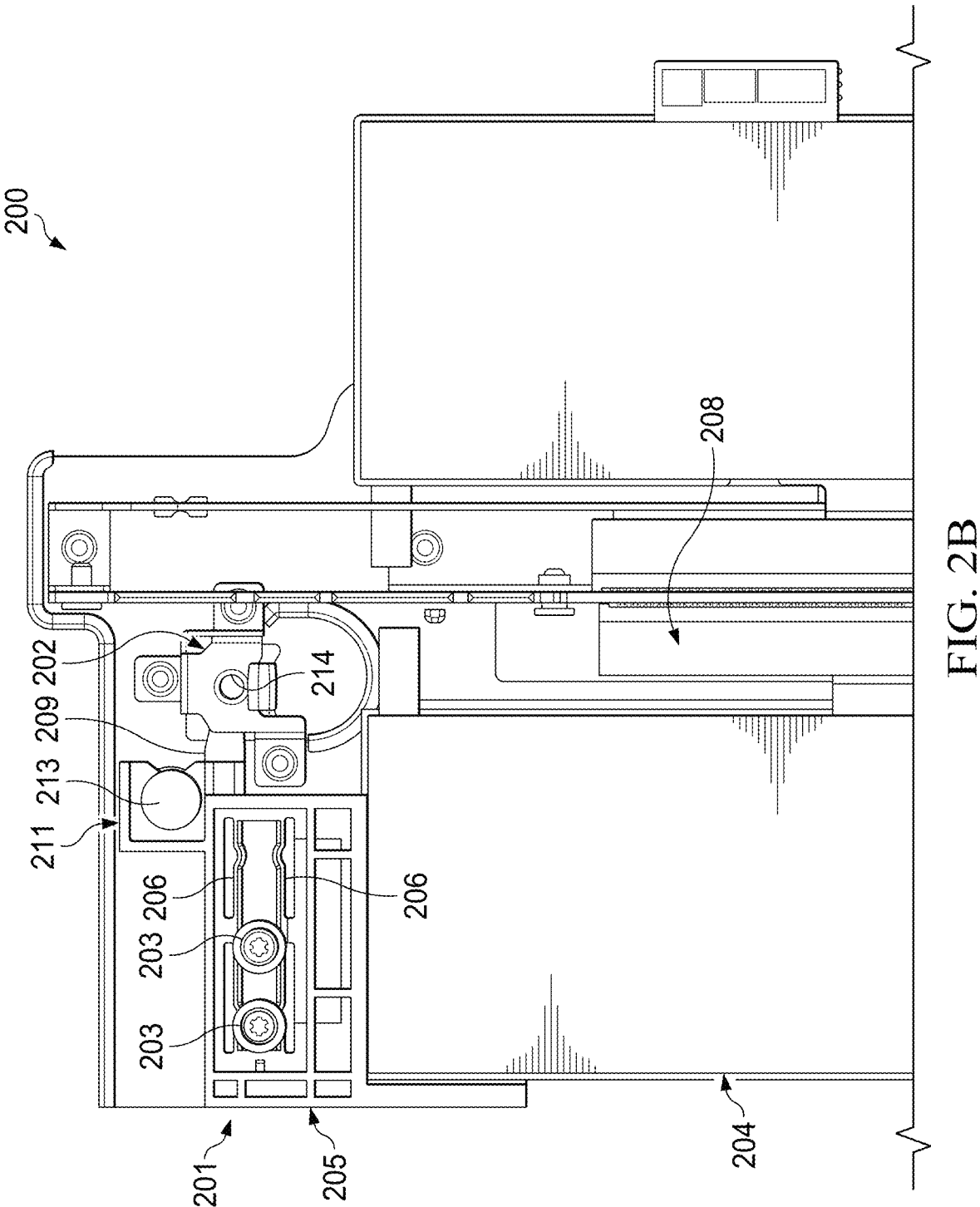

FIGS. 2A-2B illustrate plan views of selected components of an example riser assembly 200, in accordance with embodiments of the present disclosure. As shown in FIGS. 2A-2B, riser assembly 200 may comprise an expansion card latch 201 and a riser assembly latch 202. In some embodiments, expansion card latch 201 may be mechanically coupled to riser assembly 200 via bearings 203 and may be configured to facilitate installation and retention of expansion card 204 within riser assembly 200 (as shown in FIG. 2B). Expansion card latch 201 may comprise a first body 205, which may comprise a pair of rails 206. In some embodiments, the pair of rails 206 may be configured to mechanically couple to bearings 203 such that expansion card latch 201 may slidably translate between an open position (as shown in FIG. 2A) and a closed position (as shown in FIG. 2B). Expansion card latch 201 may further comprise a second body 207 extending substantially perpendicular to first body 205. As shown in FIG. 2B, first body 205 and second body 207 may be configured to mechanically engage with expansion card 204 when expansion card latch 201 is in the closed position.

In operation, a user may move expansion card latch 201 to the open position to insert an edge connector of expansion card 204 into a receptacle connector of riser card 208, and then move expansion card latch 201 to the closed position to facilitate retention of expansion card 204 within riser assembly 200.

In some embodiments, expansion card latch 201 may further comprise an arm 209 extending from first body 205. Arm 209 may be configured to thread through (e.g., insert into) riser assembly latch 202 when expansion card latch 201 is in the closed position (as shown in FIG. 2B). Arm 209 may comprise an opening 210, which may be substantially circular. As described in further detail below, opening 210 may be configured to align with an opening 214 in riser assembly latch 202 such that an alignment feature (e.g., a pin, a post) coupled to a chassis may insert through opening 210 and opening 214 and mechanically engage with riser assembly latch 202. In some embodiments, expansion card latch 201 may further comprise a third body 211 protruding substantially perpendicular to first body 205. Third body 211 may be approximately diagonally opposite to second body 207, and may comprise an opening 212 configured to mechanically engage with a post 213 mechanically coupled to riser assembly 200 when expansion card latch 201 is in the closed position (as shown in FIG. 2B).

As shown in FIGS. 2A-2B, riser assembly latch 202 may comprise an opening 214, which may be substantially circular. Opening 214 of arm 209 and opening 214 of riser assembly latch 202 may be substantially similar in shape such that when expansion card latch 201 is in the closed position, opening 214 and opening 210 may sufficiently align such that an alignment feature (e.g., a pin, a post) mechanically coupled to a chassis may insert through opening 214 and opening 210 and mechanically couple to riser assembly latch 202, thereby facilitating alignment of riser assembly 200 within a chassis and combined retention of riser assembly 200 and expansion card 204. In some embodiments, an alignment feature (e.g., a pin, a post) mechanically coupled to a chassis may be unable to mechanically couple to expansion card latch 201 and riser assembly latch 202 when expansion card latch 201 is not properly positioned in the closed position (e.g., where arm 209 may be inserted into riser assembly latch 202 but opening 210 and opening 214 may be misaligned). In other words, misalignment of opening 210 and opening 214 may prevent riser assembly 200 from being installed in a chassis.

Figure 3:
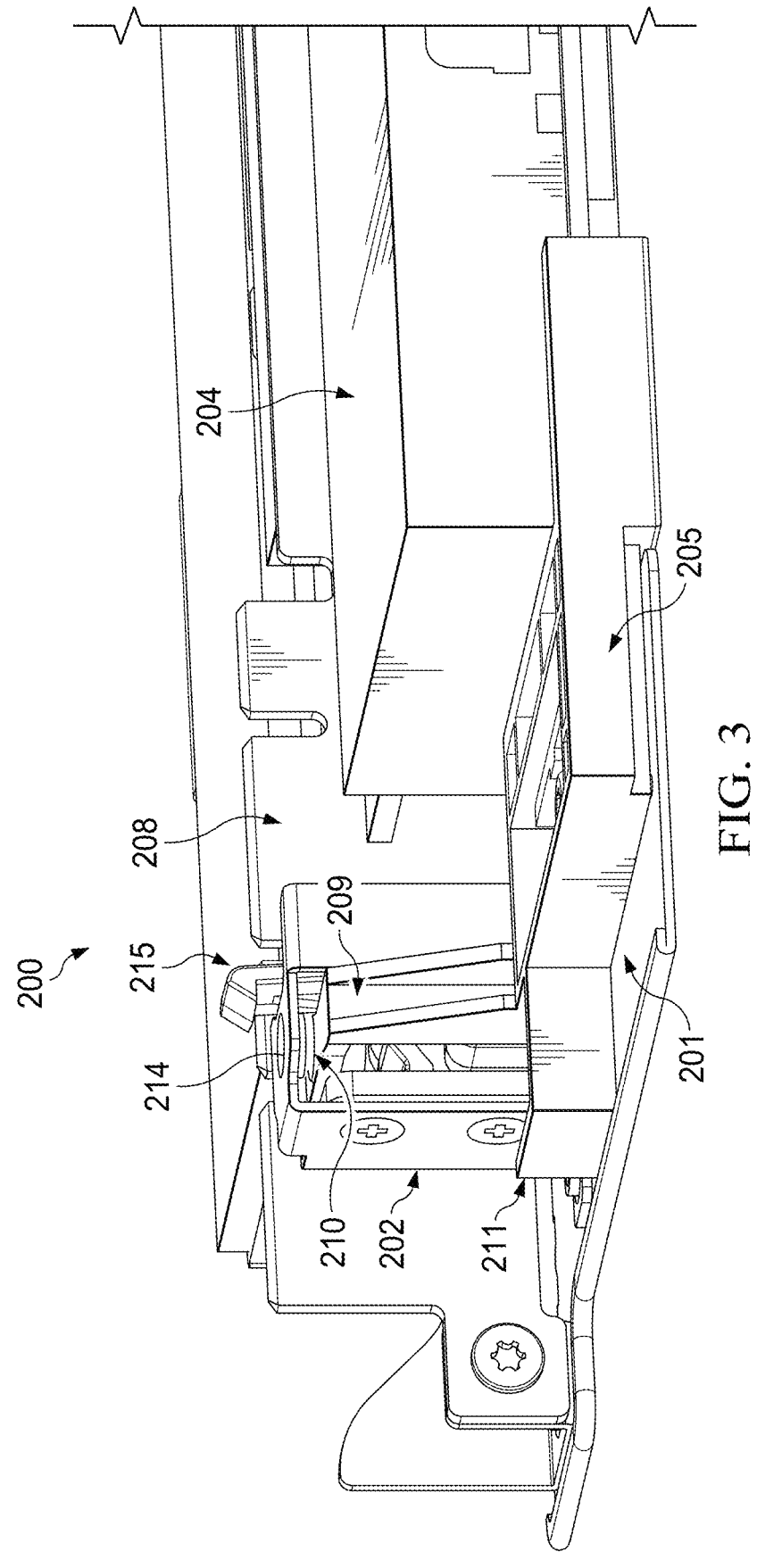
FIG. 3 illustrates a perspective view of selected components of the example riser assembly of FIGS. 2A-2B, in accordance with embodiments of the present disclosure.

FIG. 3 illustrates a perspective view of selected components of the example riser assembly 200 of FIGS. 2A-2B, including an expansion riser card latch 201 in a closed position, in accordance with embodiments of the present disclosure. As shown in FIG. 3, expansion riser card latch 201 may be mechanically coupled to riser assembly 200 and may be configured, when in a closed position, to facilitate and secure electronic and mechanical coupling between expansion card 204 and riser card 208. As further shown in FIG. 3, when expansion riser card latch 201 is in the closed position, arm 209 of expansion riser card latch 201 may thread through (e.g., insert into) riser assembly latch 202 such that opening 210 of arm 209 and opening 214 of riser assembly latch 202 align. In some embodiments, riser assembly latch 202 may further comprise a stop (not shown) configured to prevent over-translation of arm 209. Riser assembly latch 202 may also comprise latching mechanism 215 configured to mechanically engage with an alignment feature (e.g., a pin, a post) mechanically coupled to a chassis. In some embodiments, latching mechanism 215 may comprise a substantially hook-shaped end configured to mechanically engage with the alignment feature.

Figure 4:
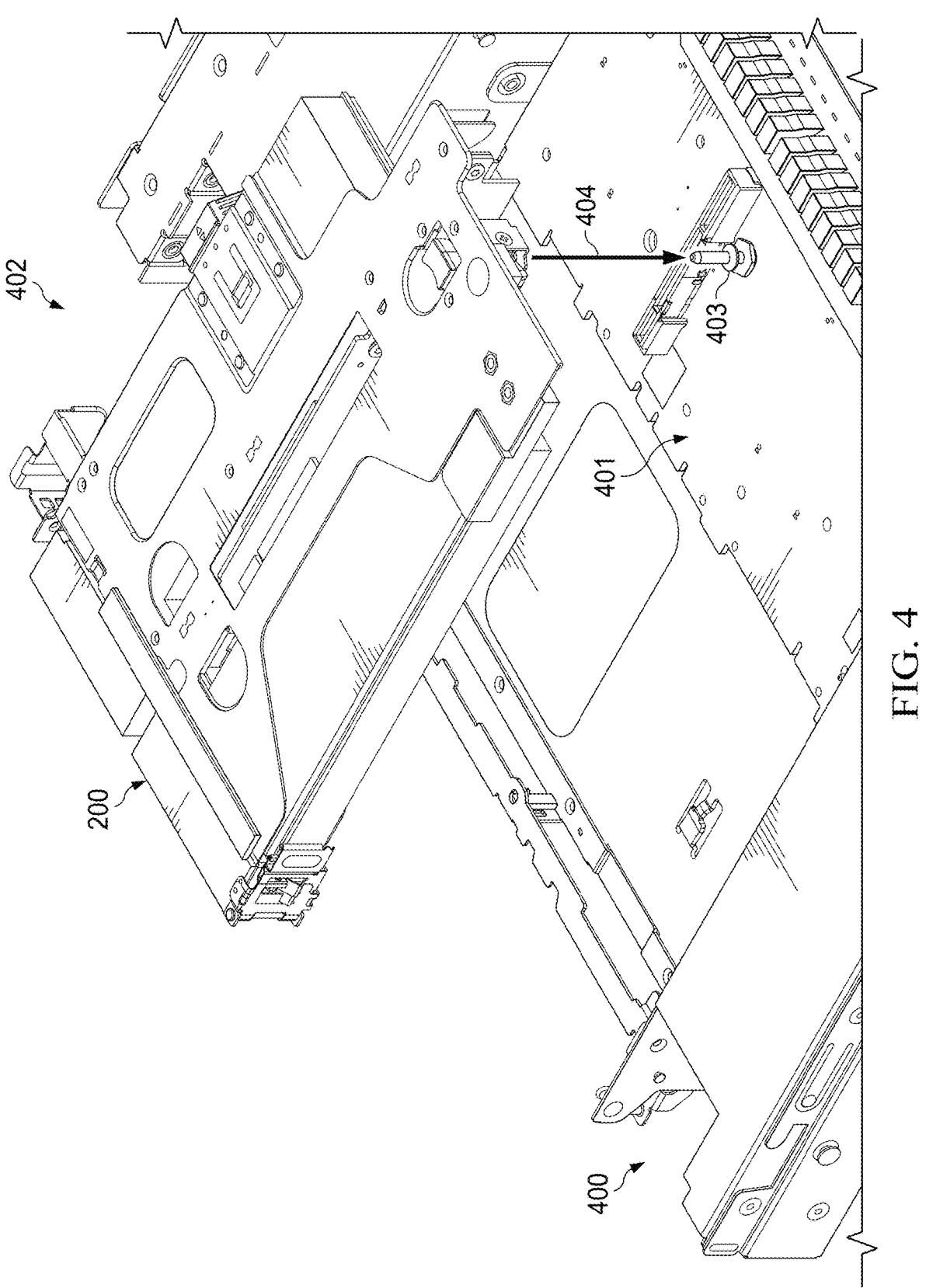
FIG. 4 illustrates a perspective view of a mechanism of installing the example riser assembly of FIGS. 2A-2B in an example information handling system, in accordance with embodiments of the present disclosure.

FIG. 4 illustrates a perspective view of a mechanism of installing the example riser assembly 200 of FIGS. 2A-2B in an example information handling system 402, in accordance with embodiments of the present disclosure. As shown in FIG. 4, information handling system 402 may comprise a chassis 400 that houses a motherboard 401. Chassis 400 may comprise an alignment feature 403 (e.g., a pin, a post) mechanically coupled to chassis 400 and protruding through motherboard 401.

In operation, when expansion card latch 201 is in a closed position, a user may mechanically couple riser assembly 200 to chassis 400 by aligning riser assembly 200 with alignment feature 403 such that when a user moves riser assembly 200 in a direction of arrow 404, alignment feature 403 may insert through opening 210 of expansion card latch 201 and opening 214 of riser assembly latch 202 and mechanically engage with latching mechanism 215 of riser assembly latch 202. When latching mechanism 215 is mechanically engaged with alignment feature 403, expansion card 204 may be locked in to riser card 208 (e.g., may be unable to be moved or removed), and may be moved or removed only when riser assembly 200 is removed from chassis 400.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising: a chassis; and an information handling resource assembly configured to carry one or more information handling resources, wherein the information handling resource assembly comprises:
    a first latch configured to retain the information handling resource assembly within the chassis; and
    a second latch slidably coupled to the information handling resource assembly and configured to translate between:

a closed position, wherein the second latch inserts into the first latch such that the first latch and the second latch are configured to mechanically couple to an alignment feature mechanically coupled to the chassis and protruding through a motherboard; and
    an open position, wherein the second latch is removed from the first latch and the information handling resource assembly is configured to receive the one or more information handling resources.

2. The information handling system of claim 1, wherein:
the first latch comprises:
    an opening configured to receive the alignment feature; and
    a hook structure configured to mechanically couple to the alignment feature; and
the second latch comprises:
    a first structure slidably coupled to the information handling resource assembly and configured to translate between the open position and the closed position; and
    an arm extending from the first structure, wherein the arm comprises an opening configured to receive the alignment feature, and wherein the arm is configured to insert into the first latch such that the opening of the arm aligns with the opening of the first latch in the closed position.

3. The information handling system of claim 2, wherein misalignment of the opening of the arm and the opening of the first latch prevents mechanical coupling of the first latch and the second latch with the alignment feature.

4. The information handling system of claim 2, wherein the first structure of the second latch comprises a pair of rails configured to couple to one or more bearings mechanically coupled to the information handling resource assembly such that the second latch is configured to translate between the open position and the closed position via the pair of rails.

5. The information handling system of claim 2, the second latch further comprising a second structure extending substantially perpendicular from the first structure and configured to retain the one or more information handling resources in the information handling resource assembly.

6. A combined retention feature comprising:
    a first latch configured to retain an information handling resource assembly within a chassis; and
    a second latch configured to slidably couple to the information handling resource assembly and further configured to translate between:
    a closed position, wherein the second latch inserts into the first latch such that the first latch and the second latch are configured to mechanically couple to an alignment feature mechanically coupled to the chassis and protruding through a motherboard; and
    an open position, wherein the second latch is removed from the first latch and the information handling resource assembly is configured to receive the one or more information handling resource.

7. The combined retention feature of claim 6, wherein:
the first latch comprises:
    an opening configured to receive the alignment feature; and
    a hook structure configured to mechanically couple to the alignment feature; and
the second latch comprises:
    a first structure configured to slidably couple to the information handling resource assembly and configured to translate between the open position and the closed position; and an arm extending from the first structure, wherein the arm comprises an opening configured to receive the alignment feature, and wherein the arm is configured to insert into the first latch such that the opening of the arm aligns with the opening of the first latch in the closed position.

8. The combined retention feature of claim 7, wherein misalignment of the opening of the arm and the opening of the first latch prevents mechanical coupling of the first latch and the second latch with the alignment feature.

9. The combined retention feature of claim 7, wherein the first structure of the second latch comprises a pair of rails configured to couple to one or more bearings mechanically coupled to the information handling resource assembly such that the second latch is configured to translate between the open position and the closed position via the pair of rails.

10. The combined retention feature of claim 7, the second latch further comprising a second structure extending substantially perpendicular from the first structure and configured to retain the one or more information handling resources in the information handling resource assembly.

11. A method of forming a combined retention feature comprising:

mechanically coupling a first latch to an information handling resource assembly, wherein the information handling resource assembly is configured to carry one or more information handling resources; and mechanically coupling a second latch to the information handling resource assembly;

wherein:

the first latch is configured to retain the information handling resource assembly within the chassis; and the second latch is slidably coupled to the information handling resource assembly and configured to translate between:

a closed position, wherein the second latch inserts into the first latch such that the first latch and the second latch are configured to mechanically couple to an alignment feature mechanically coupled to the chassis and protruding through a motherboard; and an open position, wherein the second latch is removed from the first latch and the information handling resource assembly is configured to receive the one or more information handling resources.

12. The method of claim 11, wherein:

the first latch comprises:

an opening configured to receive the alignment feature; and a hook structure configured to mechanically couple to the alignment feature; and the second latch comprises:

a first structure configured to slidably couple to the information handling resource assembly and configured to translate between the open position and the closed position; and an arm extending from the first structure, wherein the arm comprises an opening configured to receive the alignment feature, and wherein the arm is configured to insert into the first latch such that the opening of the arm aligns with the opening of the first latch in the closed position.

13. The method of claim 12, wherein misalignment of the opening of the arm and the opening of the first latch prevents mechanical coupling of the first latch and the second latch with the alignment feature.

14. The method of claim 12, wherein the first structure of the second latch comprises a pair of rails configured to couple to one or more bearings mechanically coupled to the information handling resource assembly such that the second latch is configured to translate between the open position and the closed position via the pair of rails.

15. The method of claim 12, the second latch further comprising a second structure extending substantially perpendicular from the first structure and configured to retain the one or more information handling resources in the information handling resource assembly.

* * * * *